(12) United States Patent
Bradley

(10) Patent No.: US 6,341,064 B1
(45) Date of Patent: Jan. 22, 2002

(54) METHOD AND APPARATUS FOR THERMAL MANAGEMENT IN A TELECOMMUNICATIONS EQUIPMENT CABINET

(75) Inventor: Eddie R. Bradley, Richardson, TX (US)

(73) Assignee: Alcatel USA Sourcing, L.P., Plano, TX (US)

(*) Notice: Subject to any disclaimer, the term of this patent is extended or adjusted under 35 U.S.C. 154(b) by 0 days.

(21) Appl. No.: 09/541,410

(22) Filed: Mar. 31, 2000

(51) Int. Cl.⁷ ................................ H05K 7/20
(52) U.S. Cl. .................. 361/695; 62/259.2; 454/184
(58) Field of Search .................. 62/259.2; 454/184; 361/687–688, 690–697, 796

(56) References Cited

U.S. PATENT DOCUMENTS

| | | | | |
|---|---|---|---|---|
| 5,027,254 A | * | 6/1991 | Corfits et al. ............... | 361/695 |
| 5,398,161 A | * | 3/1995 | Roy ............................ | 361/695 |
| 5,497,288 A | * | 3/1996 | Otis et al. ................... | 361/695 |

* cited by examiner

*Primary Examiner*—Gregory Thompson
(74) *Attorney, Agent, or Firm*—Smith, Danamraj & Youst, P.C.

(57) ABSTRACT

The compact PCI cabinet includes an inlet port for receiving external air, a set of blowers for drawing the air into the cabinet and for expelling the air from an exhaust port of the cabinet after having cooled internal active circuits, and a plurality of louvers and openings that create thermal convection within a back portion of the compact PCI cabinet to cool active components coupled to the back side of the back plain of the compact PCI system. Additionally, a plurality of perforated air openings located approximately at the bottom and back side of a side panel of the compact PCI cabinet also is included to conduct an receive some air from the external environment. Openings are formed between a plurality of card guides located approximately at the top of the back side of the back portion of the PCI cabinet for conducting air in and out of the back portion of the cabinet. A pin field coupled to a heat sink is placed in the air path between the blowers and the openings through which the air may be conducted into the back portion of the compact PCI cabinet to reduce the exhaust air temperature. Finally, the invention includes a thermistor placed in the exhaust path so that the fan speed of the blowers maybe adjusted according to the temperature of the exhaust after passing through the pin field.

18 Claims, 4 Drawing Sheets

METHOD AND APPARATUS FOR THERMAL MANAGEMENT IN A TELECOMMUNICATIONS EQUIPMENT CABINET

BACKGROUND

1. Field of the Invention

The invention relates to signal transfer points (STPs) used in telecommunication networks and, more particularly, to cabinet designs for STPs.

2. Description of the Related Art

Advanced Intelligent Networks (AIN) are modern telephone networks that separate call control from the actual trunk that carries the voice or data transmission of a call. In general, AIN Networks include a system in which the network queries a database to determine how a call should be processed once a set of call digits have been received from a phone. AIN Network generally includes three basic elements. A signal control point (SCP) is a computer controlled database that is for storing customer's specific information that is used by the network to determine how to route and/or process calls. A signal switching point (SSP) is a digital telephone switch that is operable to communicate with SCPs and to obtain the customer's specific instructions for processing the call. A signal transfer point (STP) is a packet switch that shuttles messages between the SSPs and the SCPs. All three, namely the SCP, the SSP, and the STP communicate via what is known as out-of-band signaling. Out-of-band signaling generally refers to the signaling that is for controlling a call. In other words, out-of-band signaling does not include the actual call data or voice information. Typically, the three described systems utilize a signaling system No. 7 (SS7) protocol or a variant thereof.

When a call is dialed, the SSP creates a query to the database within the SCP to find out how a call should be processed. The query is passed via out-of-band signaling through at least one STP to the SCP. The SCP interprets the query based on criteria within its databases and based upon information provided by the SSP. Once the SCP retrieves and transmits a return message through the STPs to the SSPf SSP may properly process the call within the network.

The STP is, in essence, a router for the SS7 network. It relays messages through the network but does not originate them. It is similar to a voice switch except that it only routes control signals. STPs also serve as gateway devices that may convert messages that flow between dissimilar systems. For example, a STP within the US may provide conversions between ANSI SS7 and ITU-T SS7. STPs may also provide other functionality including various security functions and message filtering wherein messages of a non-conforming nature are not passed through from one point to another. Other STP functions include traffic monitoring for billing purposes and for developing usage statistics.

Compact PCI is an adaptation of the Peripheral Component Interconnect (PCI) specification for industrial and/or embedded applications requiring a more robust mechanism form factor than desktop PCI. Compact PCI uses industry standard mechanical components and high performance connector technologies to provide a system optimized for rugged applications. Compact PCI is electrically compatible with the PCI specification allowing low cost PCI chip sets to be used in a mechanical form factor suited for rugged environments. In general, Compact PCI is a rugged variation of the PCI bus that was designed by PC makers wanting to create industridi grade PCs. The motivations for the design were to put more PCI cards into one PC (eight instead of four) and to make the resulting PC more rugged, and better able to withstand shaking and rough environmental conditions.

The physical configuration of the hardware conforms to the Eurocard (VMR-style) standard. The cards are identical to VME cards in size but differ in that they use a high-density 2-millimeter pin and socket connector (contact space) for interfacing the card to a passive backplane. Typically, the Compact PCI comes in a rugged 3U or 6U Eurocard form factor and has either a 32 or 64 bit data bus with transfer rates of up to 528 megabits per second.

As mentioned before, Compact PCI typically includes a passive backplane. Each shelf on the front side of a Compact PCI system includes slots for eight cards. Traditionally, a controller goes into slot one leaving seven slots for other specialized peripheral cards. Accordingly, cabinets made to house Compact PCI equipment typically provides cooling only to a front portion of the cabinet. The "front portion" is the portion that is in front of the backplane.

Traditionally, active cards go in the front side while passive circuitry goes on the backside. In a typical configuration, a Compact PCI card having active elements includes pin outs that are passed through the backplane to passive transition modules on the back side. The transition modules terminate the signals into connectors wherein that may readily be accessed from behind. Because the circuitry on the back side of the backplane is passive, there has been no need hereto before to provide cooling or thermal management for the back side of the Compact PCI cabinet in a telecommunications environment.

A current design goal for the present invention is to utilize Compact PCI in the design of modern telecommunication systems. As systems become more complex, however, Compact PCI systems are being pushed to the limit in terms of capacity. A typical cabinet for a Compact PCI system may have several shelves of cards all generating tremendous amounts of heat energy for a cabinet of that size. Accordingly, thermal management issues may become acute. As telecommunication networks continue to increase in sophistication, there will be an ever-increasing need to add more circuitry within the Compact PCI cabinets. Unfortunately, however, this also means that more space must be found to provide the additional card slots. Greater thermal management must be achieved to maintain temperatures at an acceptable level if new cards are added. What is needed, therefore, is a cabinet architecture that provides for greater circuit capacity and yet accommodates an efficient thermal management system therefor, preferably within the context of a Compact PCI-compliant equipment rack.

SUMMARY OF THE INVENTION

The Compact PCI cabinet includes an inlet port for receiving external air, a set of blowers for drawing the air into the cabinet and for expelling the air from an exhaust port of the cabinet after having cooled internal active circuits, and a plurality of louvers and openings that create thermal convection within a back portion of the Compact PCI cabinet to cool active components coupled to the back side of the backplane of the Compact PCI system. More specifically, a bottom panel, lining one wall of the chamber that receives the external air through the input port, includes a plurality of louvers that allow some of the air to be conducted into the back portion of the Compact PCI cabinet. Additionally, a plurality of perforated air openings located approximately at the bottom and back end of a side panel of the Compact PCI cabinet also is included to receive and conduct air from the external environment. Finally, the invention includes forming openings between a plurality of card guides located approximately at the top of the back side of the back portion of the Compact PCI cabinet wherein air may be conducted into the back portion of a Compact PCI cabinet or out of the back portion of the Compact PCI cabinet. The air is conducted here, from and into the exhaust from the blowers.

Because exhaust from the blowers is being partially directed into the back portion of the Compact PCI cabinet, that exhaust must be cooled before it is used to cool active components in the rear portion of the cabinet. Accordingly, a pin field is placed in the air path between the blowers and the openings through which the air may be conducted into the back portion of the Compact PCI cabinet. The pin field is coupled to a heat sink that is for extracting heat energy from the pins. Accordingly, heat is convected away from the exhaust into the pins and up into the heat sink where it is radiated outwardly from the cabinet.

Finally, the invention includes placing a thermistor in the exhaust path so that the fan speed of the blowers maybe adjusted according to the temperature of the exhaust after passing through the pin field. Thus, acoustic concerns are addressed by minimizing fan speed and associated noise levels so as to operate the blowers at nearly a minimal level required for maintaining the internal temperatures within the PCI cabinet at an acceptable level.

In another embodiment of the invention, the louvered panel at the bottom of the Compact PCI cabinet is installed at an angle relative to vertical so that a greater amount of the air received at the inlet port is conducted into the back portion of the Compact PCI cabinet and so that the louvers create lower amounts of air resistance to that air which is being conducted into the back portion of the Compact PCI cabinet.

DETAILED DESCRIPTION OF THE DRAWINGS

Figure 1:
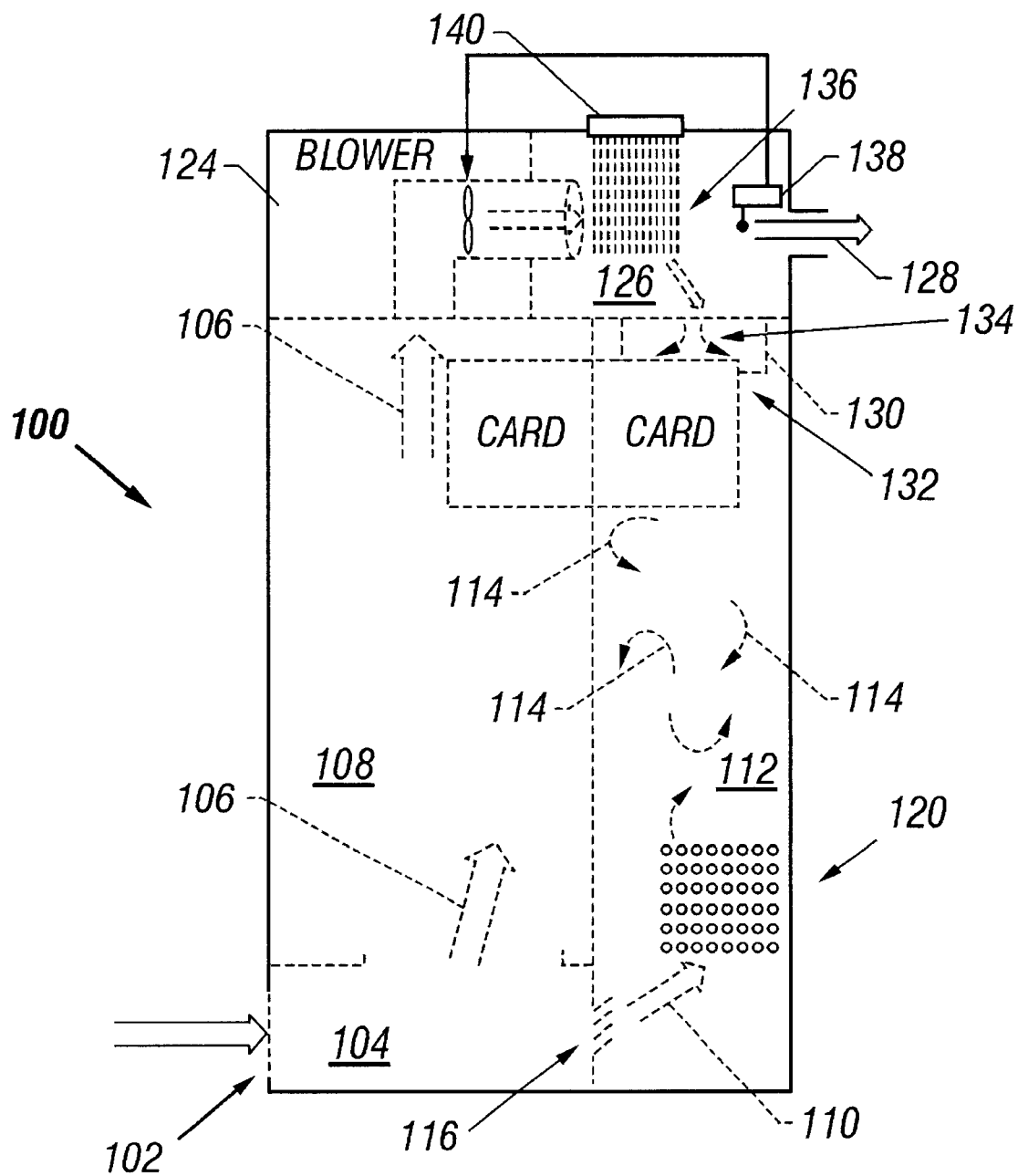
FIG. 1 is a perspective view and functional block diagram of a telecommunications cabinet formed according to one embodiment of the present invention.

FIG. 1 is a perspective view and functional block diagram of a telecommunications cabinet formed according to one embodiment of the present invention. Referring now to FIG. 1, a cabinet 100, by way of example, a signal transfer point cabinet, is formed to receive external air at an inlet port 102 formed at the bottom of the cabinet 100. Within the cabinet 100, a chamber 104 receives the external air and conducts the air primarily into a front portion 108 of the cabinet 100 but also into a rear portion 112 of the cabinet 100 through a plurality of louvers 116. As may be seen, a front portion 108 air stream 106 serves to cool the components in front portion 108. In prior art cabinets, air is conducted solely into the front portion 108 of the cabinet 100 because all active circuits and systems that generate heat are placed therein. In the cabinet 100 of FIG. 1, however, active components are also installed in the rear portion 112 of the cabinet 100. Accordingly, thermal management issues are extended to the rear portion of the cabinet.

The inventive cabinet 100 includes a panel forming a plurality of louvers 116 or other air passageways to receive air 110 from chamber 104 into rear portion 112. Air (not numbered) is also received into the rear portion 112 through a plurality of perforated air openings shown generally at 120 in the described embodiment of the invention. The perforated air openings 120 are formed approximately at the bottom and at the rear of the cabinet on both sides of the cabinet paneling. The placement of the perforated air openings 120 at or near the bottom of cabinet 100 is important. Were the perforated air openings 120 distributed along the side of the cabinet, air turbulence shown at 114 within the rear portion 112 of the cabinet could not be created which would therefore lead to ineffective thermal management and thermal properties for reducing and removing heat from the active components.

The turbulence and airflow that occurs within the cabinet 100, and more particularly, within front portion 108, i.e., first equipment portion, or rear portion 112, i.e., second equipment portion, results from the use of electrically operated blowers that are formed within a top portion of the cabinet. For example, within FIG. 1, a pair of blowers 124 are installed within the top portion of the cabinet to create a vacuum within front portion 108 and to create an exhaust path 126 of air that is emitted from an outlet port 128.

The rear portion 112 of the cabinet 100 is also formed to create openings 132 between card guides 130 to create an air conduction path 134 from the exhaust path 126 into the rear portion 112 of the cabinet. The openings 132 between the card guides 130 also enable air to be exhausted from rear portion 112 of the cabinet. Thus, as may be seen, air enters the rear portion of the cabinet through the louvers 116, through the air openings 120, and through the openings 132 between the card guides 130.

Because the exhaust air being expelled from the cabinet by the blowers 124 typically is air having a raised temperature, that air needs to be cooled prior to being introduced into rear portion 112 of the cabinet. Accordingly, the inventive cabinet includes a pin field shown generally at 136 that is coupled to a heat sink 140. The exhaust air being blown or expelled by the blowers passes through the pin field, which extracts the heat therefrom and conducts it to the heat sink 140 where it is dissipated. Thus, after passing through the pin field 136, the exhaust air either leaves the cabinet through exhaust port or outlet port 128 or, enters rear portion 112 of the cabinet through openings 132 to create turbulence therein to provide cooling for the active components therein rear portion 112 of cabinet 100.

Figure 2A:
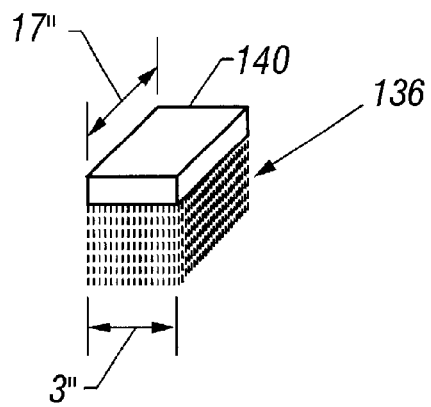
FIG. 2A is a perspective view of a pin field, comprising a plurality of pins attached to a heat sink according to one aspect of the present invention.

The system of FIG. 1 further comprises a thermistor 138 placed in the air stream of the exhaust air being expelled from the cabinet 100 by the blowers 124. The thermistor 138 is used to control the fan speed of the blowers 124. Accordingly, as the exhaust temperature increases, the thermistor increases the fan speed of the blowers to create increased air flow through the cabinet 100 to provide increased cooling. On the other hand, lower cabinet 100 temperatures result in lower fan speeds which results in lower noise levels. The lower fan speeds thus improves the acoustic characteristics of the cabinet due to FIG. 2A is a perspective view of a pin field, comprising a plurality of pins attached to a heat sink according to one aspect of the present invention. The pin field, shown generally at 136 comprises approximately 200–250 pins in the described embodiment wherein the pins are formed of aluminum, as is the heat sink 140 to which they are attached. In the described embodiment of the invention, the heat sink 140 is approximately 3 inches wide by 17 inches long. The exhaust air is conducted therethrough from a 17 inch side to the other. This arrangement is used so as to reduce air flow resistance, the noise typically produced by blowers 124.

Figure 2B:
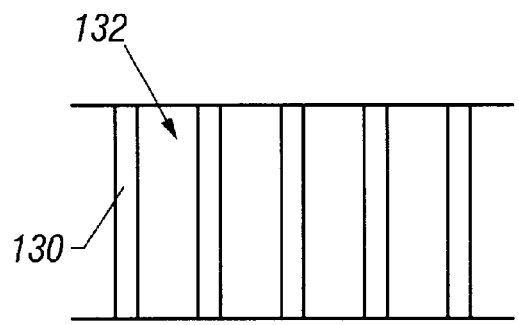
FIG. 2B is a top respective view of a plurality of openings formed and defined by a plurality of card guides for conducting air in and out of a rear portion of a cabinet according to one embodiment of the present invention.

FIG. 2B is a top respective view of a plurality of openings formed and defined by a plurality of card guides for conducting air in and out of a rear portion of a cabinet according to one embodiment of th e present invention. Referring now to FIG. 2B, a plurality of card guides 130 form a plurality of openings 132. Exhaust air being expelled is directed along an air flow path just above the opening 132 to allow the exhaust air to partially flow into the rear portion of a cabinet.

Figure 3:
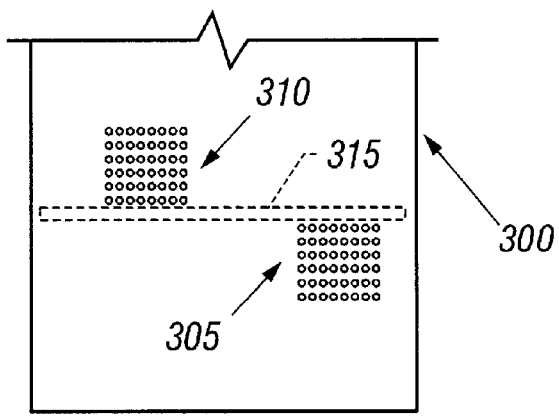
FIG. 3 is a side view of a signal transfer point cabinet 102 illustrating the placement of a plurality of perforated air openings according to an alternate described embodiment of the invention.

FIG. 3 is a side view of a signal transfer point cabinet 300 illustrating the placement of a plurality of perforated air openings according to an alternate described embodiment of the invention. Referring now to FIG. 3, a first group of perforated air openings 305 is provided for supplying air to a back portion of a signal transfer point cabinet. This group of openings 305 is similar to openings 120 if FIG. 1. A second group of air openings 310 is provided only on a right side of cabinet 300 for conducting air to the components of a board placed in the right most slot (from a front view) of a card shelf 315. Here, openings 305 are the same as those described in FIG. 1 as air openings 120. Air openings 310 are an optional set of openings formed primarily to cool the active components of the right most card. Viewing a signal transfer point shelf from the front, the orientation of the cards results in the printed circuit board portion facing left while the components face right. For all cards except for the right most one, airflow within the front portion 108, of FIG. 1, for example, cools all of the active elements of all the cards except the right most one. For the right most card, however, its own printed circuit board reduces airflow to its components. Thus, to alleviate the problem, one embodiment of the present invention includes a plurality of air openings 310 to cool the components of the right most card. As may be seen, the air openings 310 are placed physically at a height that is just above the height of a card shelf 315.

Figure 4:
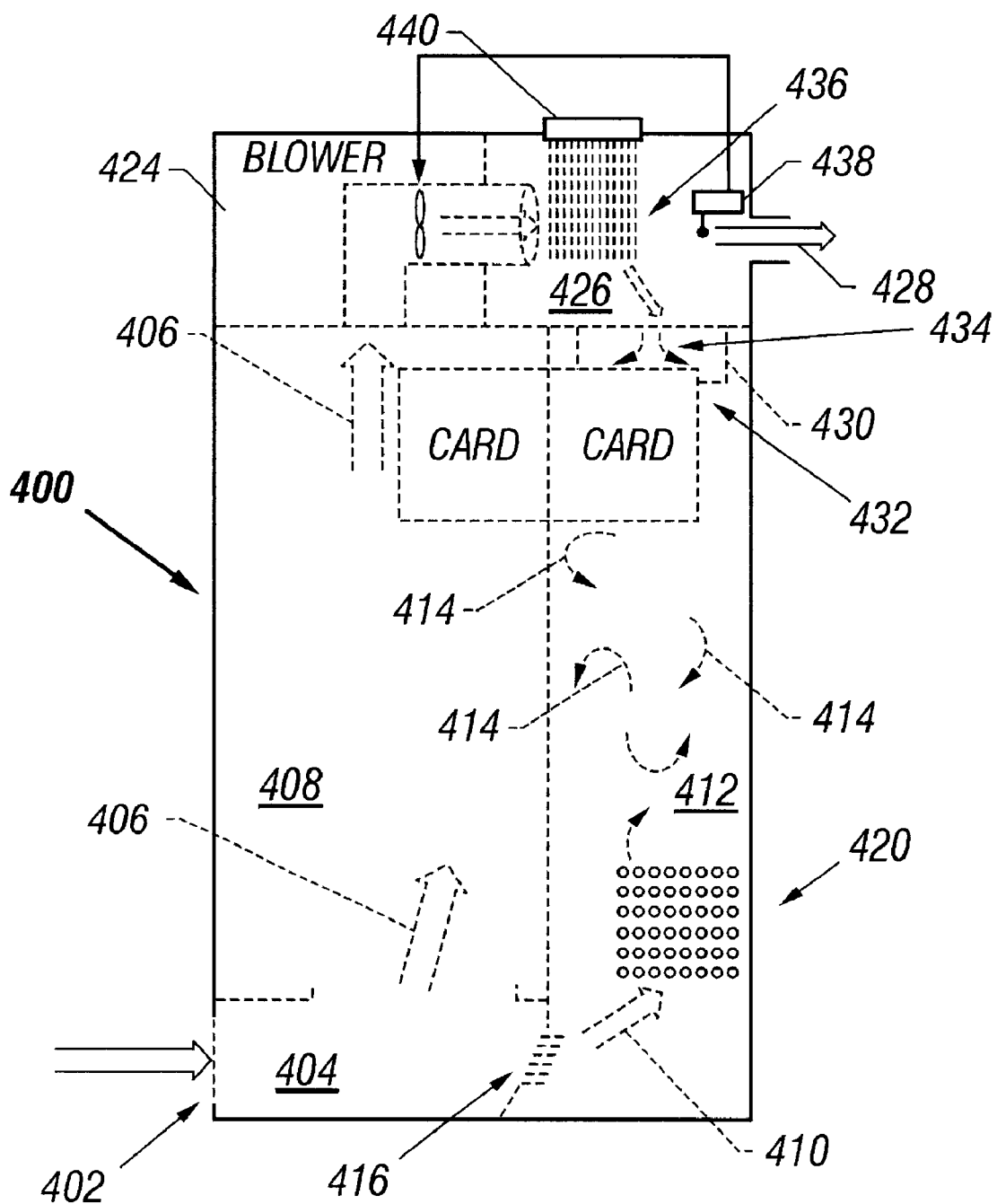
FIG. 4 is a perspective view and functional block diagram of a telecommunications cabinet formed according to an alternate embodiment of the present invention.

FIG. 4 is a perspective view and functional block diagram of a telecommunications cabinet formed according to another exemplary embodiment of the present invention. A cabinet 400, by way of example, an STP cabinet is formed to receive external air at an inlet port 402 formed at the bottom of the cabinet. Within the cabinet, a chamber 404 receives the external air and conducts the air primarily into a front portion of the cabinet 408 but also into a rear portion of the cabinet 412 through a plurality of louvers 416. As may be seen, a front portion 408 air stream 406 serves to cool the components in front portion 408. In prior art cabinets, air is conducted primarily into the front portion 408 of the cabinet because that is the area in which all active circuits and systems that generate heat are placed. In the cabinet of FIG. 4, however, active components are also installed in the rear portion 412 of the cabinet. Accordingly, thermal management issues are extended to the rear portion of the cabinet.

The inventive cabinet includes the formation of louvers 416 or other air passageways from chamber 404 into rear portion 412. Air is also received into the rear portion 412 through a plurality of perforated air openings shown generally at 420 in the described embodiment of the invention. The perforated air openings 420 are formed approximately at the bottom and at the rear of the cabinet on both sides of the cabinet paneling. The placement of the perforated air openings 420 at the bottom is important. Were the perforated air openings 420 distributed along the side of the cabinet, air turbulence shown at 414 within the rear portion 412 of the cabinet could not be created which would therefore lead to ineffective thermal management and thermal properties for reducing and removing heat from the active components.

The turbulence and airflow that occurs within the cabinet, and more particularly, within front portion 408 or rear portion 412 results from the use of electrically operated blowers that are formed within a top portion of the cabinet. For example, within FIG. 4, a pair of blowers 424 are formed within the top portion of the cabinet to create a vacuum within front portion 408 and to create an exhaust path 426 of air that is emitted from an outlet port 428. The rear portion 412 of the cabinet also is formed to create openings between card guides 430 to create an air conduction path 434 through a plurality of openings 432 from the exhaust path 426 into the rear portion 412 of the cabinet. The openings 432 between the card guides enable air to be exhausted from rear portion 412 of the cabinet. Thus, as may be seen, air enters the rear portion of the cabinet through the louvers 416, through the air openings 420, and through the openings 432 between the card guides shown generally at 430.

Because the exhaust air being expelled from the cabinet by the blowers 424 typically is air having a raised temperature, that air needs to be cooled prior to being introduced into rear portion 412 of the cabinet. Accordingly, the inventive cabinet includes a pin field shown generally at 436 that is coupled to a heat sink 440. The exhaust air being blown or expelled by the blowers passes through the pin field, which extracts the heat therefrom and conducts it to the heat sink 440 where it is dissipated. After passing through the pin field, the exhaust air either leaves the cabinet through exhaust port 428 or, enters rear portion 412 of the cabinet to create turbulence therein to provide cooling for the active components therein rear portion 412.

Continuing to refer to FIG. 4, each of these elements shown in FIG. 1 are represented here in FIG. 4 with one exception. The panel containing the louvers 416 have been formed at an angled position relative to vertical in contrast to the panel of louvers 116 of FIG. 1. Here, the angle between vertical axis and the axis of the panel forming the angled louvers is approximately 30°. One of the advantages of having angled louvers 416 is that resistance to airflow into the rear chamber is minimized. Secondly, the angled louvers 416 capture more air for conduction into the rear portion 412 then with the embodiment of FIG. 1 because the chamber 404 is reduced in size in comparison to chamber 104.

The system of FIG. 4 further comprises a thermistor 438 placed in the air stream of the exhaust air being expelled from the cabinet 400 by the blowers 424. The thermistor 438 is used to control the fan speed of the blowers 424. Accordingly, as the exhaust temperature increases, the thermistor increases the fan speed of the blowers to create increased air flow through the cabinet 400 to provide increased cooling. On the other hand, lower cabinet 400 temperatures result in lower fan speeds which results in lower noise levels. The lower fan speeds thus improves the acoustic characteristics of the cabinet due to the noise typically produced by blowers 424.

Figure 5:
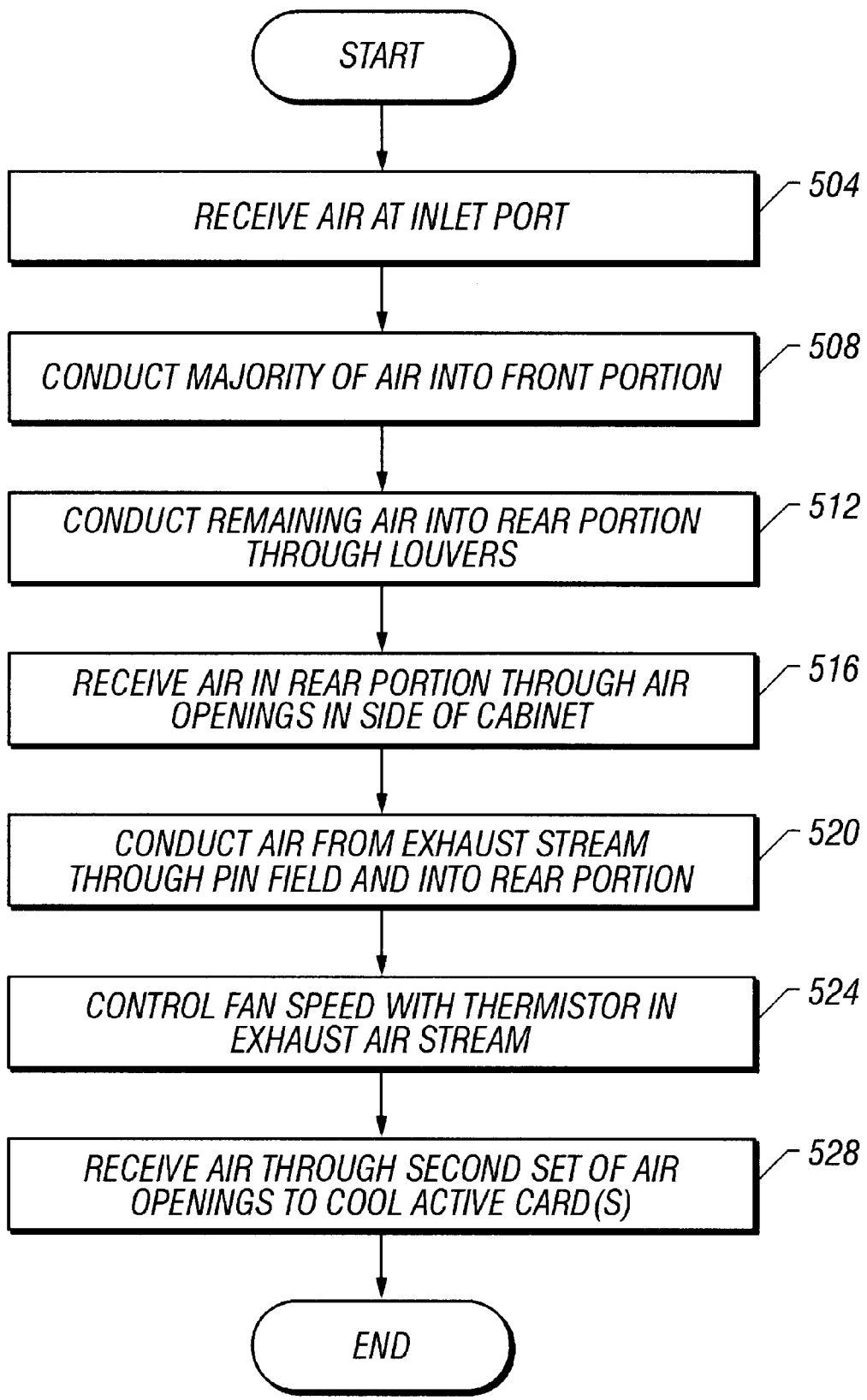
FIG. 5 is a flow chart illustrating a method for conducting air through a telecommunications cabinet according to one embodiment of the present invention.

FIG. 5 is a flow chart illustrating a method for conducting air through a telecommunications cabinet according to one embodiment of the present invention. Initially, a telecommunications cabinet receives air at an inlet port (step 504). Thereafter, it conducts the majority of the air into a front portion of the telecommunications cabinet (step 508). It then conducts the remaining air into a rear portion of the cabinet through a plurality of louvers (step 512). The air is then received in a rear portion from the louvers as wells as from openings formed in the side of the cabinet (step 516). Air is also conducted into the rear portion from an exhaust stream (step 520). As a part of conducting the air into the rear portion from the exhaust stream, however, it is first conducted through a pin field to extract hear therefrom (step 520). Finally, the invention includes controlling the fan speed of a blower with a thermistor to reduce noise levels (step 524). Finally, as an optional step, the inventions includes receiving air through a second set of air openings to cool the front side of an active card at one side of the telecommunications rack (step 528).

The invention disclosed herein is susceptible to various modifications and alternative forms. Specific embodiments therefor have been shown by way of example in the drawings and detailed description. It should be understood, however, that the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A method for conducting air through a Compact PCI cabinet, comprising:
   receiving external air through an inlet port formed at a bottom portion of said Compact PCI cabinet;
   conducting air upwards through a front portion of said Compact PCI cabinet to extract heat from a plurality of cards carrying active components, wherein the air is sucked into a blower and is expelled toward an exhaust port of said Compact PCI cabinet;
   conducting air from said bottom portion of said Compact PCI cabinet into a rear portion of said cabinet;
   conducting air from an exhaust path into said rear portion of said Compact PCI cabinet through a plurality of openings formed between a plurality of card guides;
   expelling a quantity of air from said rear portion of said Compact PCI cabinet back into said exhaust path for expulsion from said cabinet;
   conducting exhaust air through a pin field coupled to a heat sink, said pin field and said heat sink for extracting heat from said exhaust path before being partially conducted into said rear portion of said Compact PCI cabinet; and
   controlling said blower speed by monitoring the temperature of said exhaust air being expelled from said Compact PCI cabinet.

2. A telecommunications equipment cabinet, comprising:
   a first equipment portion;
   a second equipment portion;
   an inlet port disposed in said first equipment portion, said inlet port operating to admit cooling air into said first equipment portion;
   a blower coupled to said first equipment portion for drawing a first portion of said cooling air across at least one component disposed in said first equipment portion, whereby said first portion of said cooling air is transformed into a warmed air mass;
   an outlet port disposed in said second equipment portion, said outlet port operating to discharge at least a first portion of said warmed air mass via an exhaust path;
   a plurality of louvers disposed between said first equipment potion and said second equipment portion, said plurality of louvers operating to admit a second portion of said cooling air into said second equipment portion; and
   means associated with said exhaust path to provide an air conducting path for conducting a second portion of said warmed air mass from said exhaust oath into said second equipment portion, wherein said second portion of said warmed air mass is intermixed with said second portion of said cooling air for removing heat from at least one component disposed in said second equipment portion.

3. The telecommunications equipment cabinet of claim 2, wherein said means associated with said exhaust path comprises a plurality of openings spaced between a plurality of card guides.

4. The telecommunications equipment cabinet of claim 2, comprising a heat exchanger disposed relative to said exhaust path between said blower and said outlet port.

5. The telecommunications equipment cabinet of claim 4, wherein said heat exchanger comprises a pin filed coupled to a heat sink.

6. The telecommunications equipment cabinet of claim 2, comprising a temperature measuring means disposed relative to said exhaust path between said blower and said outlet port.

7. The telecommunications equipment cabinet of claim 6, wherein said temperature measuring means is a thermistor.

8. The telecommunications equipment cabinet of claim 6, wherein said temperature measuring means is electrically coupled to said blower for controlling the speed of said blower.

9. A telecommunications equipment cabinet, comprising:
   a first equipment portion;
   a second equipment portion;
   an inlet port disposed in said first equipment portion, said inlet port operating to admit cooling air into said first equipment portion;
   a blower coupled to said first equipment portion for drawing a first portion of said cooling air across at least one component disposed in said first equipment portion, whereby said first portion of said cooling air is transformed into a warmed air mass;
   a heat exchanger operating to remove heat from said warmed air mass, thereby generating an air mass of lower temperature;
   an outlet port disposed in said second equipment portions said outlet port operating to discharge at least a first portion of said air mass of lower temperature via an exhaust path;
   a plurality of louvers disposed between said first equipment potion and said second equipment portion, said plurality of louvers operating to admit a second portion of said cooling air into said second equipment portion; and
   means associated with said exhaust path to provide an air conducting path for conducting a second portion of said air mass of lower temperature from said exhaust path into said second equipment portion, wherein said second portion of said air mass of lower temperature is intermixed with said second portion of said cooling air for removing heat from at least one component disposed in said second equipment portion.

10. The telecommunications equipment cabinet of claim 9, wherein said means associated with said exhaust path comprises a plurality of openings spaced between a plurality of card guides.

11. The telecommunications equipment cabinet of claim 9, wherein said heat exchanger comprises a pin field coupled to a heat sink.

12. A telecommunications equipment cabinet, comprising:

first and second equipment portions formed in said cabinet, each equipment portion for housing at least one component therein;

an inlet port disposed in said first equipment portion, said inlet port operating to admit a first mass of cooling air into said first equipment portion;

a blower coupled to said first equipment portion for drawing a first portion of said first mass of cooling air across said at least one component disposed in said first equipment portion, whereby said first portion of said first mass of cooling air is transformed into a warmed air mass;

an outlet port disposed in said second equipment portion, said outlet port operating to discharge at least a first portion of said warmed air mass via an exhaust path;

a plurality of inlet openings provided in said second equipment portion for admitting a second mass of cooling air into said second equipment portion of said cabinet;

a plurality of louvers disposed between said first equipment portion and said second equipment portion providing a passage that permits airflow from said first equipment portion into said second equipment portion, whereby a second portion of said first mass of cooling air is admitted therethrough; and means associated with said exhaust path to provide an air conducting path for conducting a second portion of said warmed air mass from said exhaust path into said second equipment portion, wherein said second portion of said warmed air mass is intermixed with said second portion of said first mass of cooling air drawn through said plurality of louvers and with said second mass of cooling air drawn through said plurality of inlet openings for removing heat from said at least one component disposed in said second equipment portion.

13. The telecommunications equipment cabinet of claim 12, wherein said means associated with said exhaust path comprises a plurality of card guides spaced to form openings.

14. A method of thermal management in a telecommunications equipment cabinet, comprising:

drawing cooling air through an inlet port into a first equipment portion of said telecommunications equipment cabinet;

drawing a first portion of said cooling air across a plurality of components disposed in said first equipment portion, thereby transforming said first portion of said cooling air into a warmed air portion;

drawing a second portion of said cooling air from said first equipment portion into a second equipment portion;

circulating at least a portion of said warmed air portion via a heat exchanger to regenerate an air mass of lower temperature; and directing at least a portion of said air mass into said second equipment portion via an air conducting path to intermix with said second portion of said cooling air and thereby creating air turbulence therein, wherein said air turbulence operates to dissipate heat generated by a plurality of components disposed in said second equipment portion.

15. The method of thermal management of claim 14, further comprising the step of measuring the temperature of said air mass.

16. The method of thermal management of claim 15, comprising the step of controlling the speed of a blower based on the measured temperature of said air mass, said blower drawing said first portion of said cooling air into said first equipment portion.

17. The method of thermal management of claim 14, wherein said heat exchanger comprises a pin field coupled to a sink.

18. The method of thermal management of claim 14, further comprising the step of expelling a portion of said air mass through an outlet port.

* * * * *